United States Patent
Abedifard et al.

(10) Patent No.: US 6,847,565 B2
(45) Date of Patent: *Jan. 25, 2005

(54) MEMORY WITH ROW REDUNDANCY

(75) Inventors: Ebrahim Abedifard, Sunnyvale, CA (US); Frankie Fariborz Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/774,868

(22) Filed: Feb. 9, 2004

(65) Prior Publication Data
US 2004/0160826 A1 Aug. 19, 2004

Related U.S. Application Data

(63) Continuation of application No. 10/199,728, filed on Jul. 19, 2002, now Pat. No. 6,711,056, which is a continuation-in-part of application No. 09/804,125, filed on Mar. 12, 2001, now Pat. No. 6,469,932.

(51) Int. Cl.[7] ................................................ G11C 7/00
(52) U.S. Cl. .................. 365/200; 365/185.09; 365/236
(58) Field of Search ........................... 365/200, 185.09, 365/236, 185.29

(56) References Cited

U.S. PATENT DOCUMENTS

| | | |
|---|---|---|
| 5,237,535 A | 8/1993 | Mielke et al. |
| 5,327,383 A | 7/1994 | Merchant et al. |
| 5,377,147 A | 12/1994 | Merchant et al. |
| 5,559,743 A | 9/1996 | Pascucci et al. |
| 5,659,509 A | 8/1997 | Golla et al. |
| 5,659,550 A * | 8/1997 | Mehrotra et al. ........... 714/721 |
| 5,796,653 A | 8/1998 | Gaultier |
| 5,898,637 A | 4/1999 | Lakhani et al. |
| 6,034,891 A | 3/2000 | Norman |
| 6,077,211 A | 6/2000 | Vo |
| 6,134,143 A | 10/2000 | Norman |
| 6,301,152 B1 | 10/2001 | Campardo et al. |
| 6,363,020 B1 | 3/2002 | Shubat et al. |
| 6,418,051 B2 | 7/2002 | Manstretta et al. |
| 6,556,490 B2 * | 4/2003 | Shubat et al. ................ 365/200 |
| 2002/0039799 A1 | 4/2002 | Momohara |
| 2002/0157048 A1 | 10/2002 | Roohparvar |

* cited by examiner

*Primary Examiner*—Huan Hoang
(74) *Attorney, Agent, or Firm*—Leffert Jay & Polglaze, P.A.

(57) ABSTRACT

A memory device is provided. The memory device has a memory array and control circuitry to control operations to the memory array. A redundant register having a bit is also included. The bit is at a first level when two rows of the memory array are shorted together or at a second level when four rows of the memory array are shorted together. The control circuitry instructs an address counter, during an erase operation, to increment row addresses of the rows of the memory array by two rows when the bit is at the first level or four rows when the bit is at the second level.

36 Claims, 9 Drawing Sheets

MEMORY WITH ROW REDUNDANCY

CROSS REFERENCE TO RELATED APPLICATIONS

This is a continuation application of U.S. patent application Ser. No. 10/199,728 filed Jul. 19, 2002, titled "MEMORY WITH ROW REDUNDANCY," now U.S. Pat. No. 6,711,056, which application is commonly assigned, the entire contents of which are incorporated herein by reference, and which application is a Continuation-in-Part of U.S. application Ser. No. 09/804,125 filed Mar. 12, 2001, now U.S. Pat. No. 6,469,932.

TECHNICAL FIELD

The present invention relates generally to memory devices and in particular the present invention relates to a memory with row redundancy and its operation.

BACKGROUND OF THE INVENTION

Memory devices are typically provided as internal storage areas in a computer. One type of memory used to store data in a computer is random access memory (RAM). RAM is typically used as main memory in a computer environment. Most RAM is volatile. That is, RAM generally requires a steady flow of electricity to maintain its contents. As soon as the power is turned off, all data stored in the RAM is lost.

Another type of memory is a non-volatile memory. A non-volatile memory is a type of memory that retains stored data when power is turned off. A flash memory is a type of non-volatile memory. An important feature of a flash memory is that it can be erased in blocks instead of one byte at a time. Each block of memory in a memory array of the flash memory comprises rows and columns of memory cells. Many modern computers have their basic I/O system (BIOS) stored on flash memory chips.

As with other memory devices, defects can occur during the manufacture of a flash memory array having rows and columns of memory cells. Typical defects can include bad memory cells, open circuits, shorts between a pair of rows and shorts between a row and column. Shorts typically occur because of the large number of rows and columns of memory cells that have to be placed in close proximity to each other on an integrated circuit. Defects can reduce the yield of the flash memory device. A way to resolve this problem, without discarding the memory device, is to incorporate redundant elements in the memory that selectively replace defective elements. For example, redundant rows are a common form of redundant elements used in flash memory to replace a defective primary row. Redundant columns are another common form of redundant elements used in flash memory to replace a defective primary column.

After a memory die has been manufactured, it is tested for defects. Generally with volatile memory, redundancy circuitry is used to selectively route access requests directed to the defected elements to the redundant elements. Redundancy circuitry can comprise electrical fuses that are selectively "blown" (i.e. open circuited) to disconnect the shorted rows. The redundant rows are then activated to replace the shorted rows. The electrical fuses are generally blown by one of two methods. The first is known as the Ohm heating method. This method involves driving a substantial current through a fuse to melt the fuse's conductive material. The other method is known as the laser method. The laser method uses a laser to cut a fuse's conductive material. Anti-fuse circuitry can also be used. Anti-fuses are normally open and short-circuited (closed) when programmed.

Some memory devices, including some flash memory devices, utilize non-volatile registers to store addresses of primary elements that are designated to be replaced. The addresses of the primary elements are stored in the registers by the manufacturer. The registers are generally coupled to a redundant circuit. The redundant circuit compares address requests to addresses stored in the registers. If an address request matches an address stored in a register, the redundant circuit directs or maps the access request to the redundant row instead of the shorted row.

Generally, the use of redundant elements work well, however, problems can occur if the defect involves shorts between two rows or shorts between a row and a column in the primary array. This is because, even though a redundant row or column is read to or written to instead of the shorted row or column, the short is still embedded in the primary memory array and the defect can effect other elements in the primary memory array. One problem generally arises during pre-program and soft program cycles of an erase operation. An erase operation is an algorithm that typically comprises a pre-programmed cycle, an erase cycle and a soft program cycle. The pre-programmed cycle of an erase operation puts each memory cell in a programmed state by applying a program pulse to each row of memory cells. The soft program cycle or heal cycle corrects any over-erased memory cells after the erase cycle has been completed by applying a soft program pulse to the over-erased memory cells.

Disabling the redundancy circuit during the pre-program and soft program cycle when a row or column is addressed that is shorted to another row is one method of dealing with this problem. This allows the pre-program and soft program cycle to be applied to the shorted rows and columns in the primary memory array. By doing this, the effect of the shorts on other elements in the primary memory array is eliminated or at least minimized.

However, a problem arises when dealing with a row-to-row short. When a first row is addressed that is shorted to a second row and a pre-program pulse of a pre-program cycle is applied or a soft program pulse of a soft program cycle is applied, the second row also receives the respective pre-program pulse or soft program pulse. This creates a conflict between a driver of the first shorted row and the driver of the second shorted row that could lead to a collapse of the voltage supply that is driving the rows. If this were to happen, the memory cells in the first and second rows may not get properly programmed. A method of dealing with this problem is by activating the first row and the second row and simultaneously applying the respective pre-program cycle or soft program cycle to the rows. This in turn, creates another problem when the address is incremented after the respective pre-program cycle or soft program cycle has been completed because the next address will be the second shorted row. A way to skip over the second row is needed or another pre-program cycle or soft program cycle will be applied to the first and second shorted rows. This could potentially place too much charge on the memory cells of the rows.

For the reasons stated above, and for other reasons stated below which will become apparent to those skilled in the art upon reading and understanding the present specification, there is a need in the art for a flash memory that has the ability to reduce exposure of programming voltages to rows shorted together.

SUMMARY

The above-mentioned problems with memory devices and other problems are addressed by the present invention and will be understood by reading and studying the following specification.

In one embodiment, a memory device is provided. The memory device has a memory array and control circuitry to control operations to the memory array. A redundant register having a bit is also included. The bit is at a first level when two rows of the memory array are shorted together or at a second level when four rows of the memory array are shorted together. The control circuitry instructs an address counter, during an erase operation, to increment row addresses of the rows of the memory array by two rows when the bit is at the first level or four rows when the bit is at the second level.

In another embodiment, a memory device is provided. The memory device has a memory array arranged in rows and columns. The memory array has a redundant row for selectively replacing an associated defective row in the memory array. A register for the redundant row to store a redundancy address corresponding to an address of the associated defective row in the memory array and for storing a first or second bit level respectively indicative of two rows or four rows of the memory array shorted together is included. Also included is a redundancy circuit for comparing row addresses of the rows of the memory array to the redundancy address. The memory device has control circuitry to control memory operations. The control circuitry applies a program cycle of an erase operation to two rows of the memory array simultaneously and instructs an address counter to increment the row addresses by two rows when the bit is at the first level and when one of the row addresses matches the redundancy address, or the control circuitry applies the program cycle to four rows of the memory array simultaneously and instructs the address counter to increment the row addresses by four rows when the bit is at the second level and when one of the row addresses matches the redundancy address.

In another embodiment, a method for operating a memory device is provided. Included in the method is reading a bit of a redundant register. The bit is at a first level when two rows of a memory array are shorted together or a second level when four rows of the memory array are shorted together. Applying a program cycle of an erase cycle to the two rows shorted together simultaneously when the bit is at the first level or to the four rows shorted together simultaneously when the bit is at the second level is included in the method. The method also includes incrementing a row address by two rows when the bit is at the first level or by four rows when the bit is at the second level.

Yet another embodiment provides a method for operating a memory device including comparing a row address of a row of a memory array to a redundancy address of a register. The redundancy address corresponds to a defective row of the memory array. Also included in the method is reading a bit of the register when the row address matches the redundancy address. The bit is at a first level when two rows of the memory array are shorted together or a second level when four rows of the memory array are shorted together. Applying a program cycle of an erase cycle to the two rows shorted together simultaneously when the bit is at the first level or to the four rows shorted together simultaneously when the bit is at the second level is also included in the method. The method further includes incrementing the row address by two rows when the bit is at the first level or by four rows when the bit is at the second level.

In another embodiment, method for repairing a memory device is provided. The method includes identifying x rows shorted together and replacing the x rows with x redundant rows. The method also includes programming an extra bit of at least a lowest address of the x rows to indicate an x-row short.

Further embodiments of the invention include methods and apparatus of varying scope.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
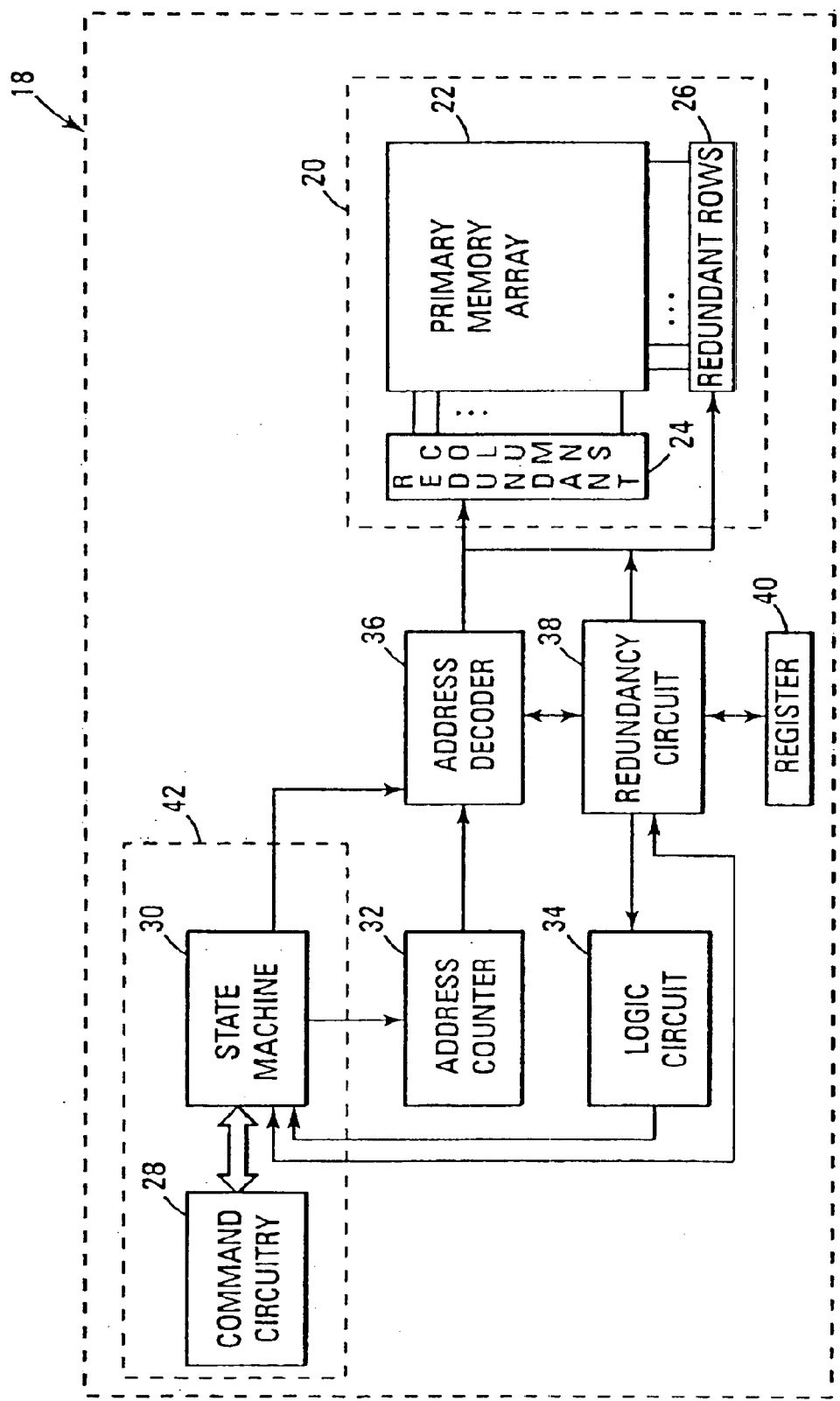
FIG. 1 is a block diagram illustrating one embodiment of the present invention.

In the present invention, a signal is sent to an address counter directing the address counter to increment a row address after a pre-program cycle or soft program cycle (program cycle) has been applied simultaneously to a pair of rows shorted together. This ensures that the cells of the shorted rows only receive the program cycle one. FIG. 1 is a simplified illustration of a flash memory device 18 of the present invention. As illustrated, the present invention includes a memory array 20. The memory array 20 is illustrated as having a primary memory array 22, redundant columns 24 and redundant rows 26. The redundant columns 24 and redundant rows 26 are mapped into the primary array 22 to replace defective columns and rows in the primary array 22.

Command circuitry 28 is provided to control the basic operations of the memory device 18. A state machine 30 is also provided to control specific operations performed on the memory array and cells. The command circuitry 28 and/or state machine 30 can be generally referred to as control circuitry 42. The control circuitry 42 controls read, write, erase and other memory operations. The memory device 18 further has an address counter 32 to increment an address of the memory array 20. The state machine 30 or control circuitry 42 directs operations of the address counter 32.

The memory device further has an address decoder 36 coupled to the state machine 30 and the address counter 32. In addition, a redundancy circuit 38 is coupled to the address decoder 36. The redundancy circuit 38 compares address requests to addresses stored in a redundant register 40 or register 40. The addresses stored in the register 40 represent addresses of defective primary rows or columns. When the redundancy circuit finds a match, it redirects the address request from the defective row or column in the primary memory array 22 to the respective replacement redundant row or column. An external processor can be coupled to the control circuitry 42 to provide external information.

Figure 2:
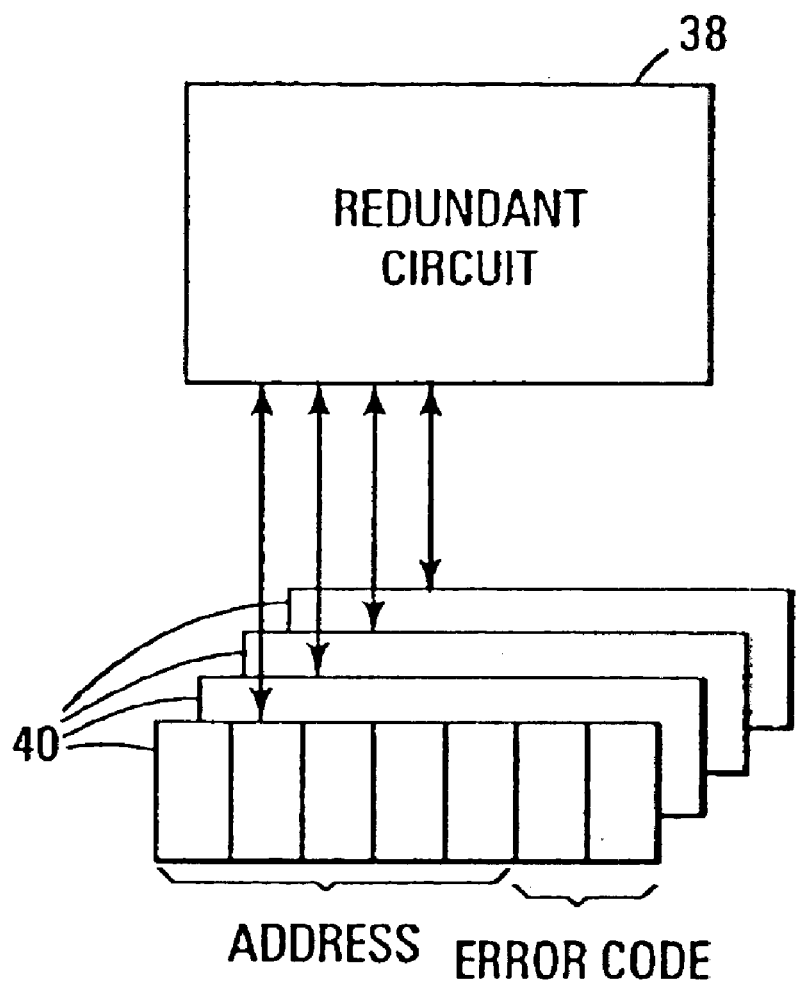
FIG. 2 is a block diagram illustrating the redundant circuit and registers of one embodiment of the present invention.

The redundancy circuit 38 and the register 40 in one embodiment of the present invention are illustrated in FIG. 2. As illustrated, the register 40 stores an address of an associated redundancy element. The register 40 also has at least one extra memory cell or bit to store an error code. The error code designates the type of error the redundancy element is used to correct. That is, the error code describes the defect in the element in the primary array that is corrected by the redundancy element. FIG. 2 illustrates four registers 40. However, it will be recognized by those in the art, that the number of registers used will depend on the number of redundant elements used to repair defective elements in a primary memory array and the present invention is not limited to four registers.

In one embodiment of the present invention, when the redundancy circuit 38 discovers an address request that matches an address of a redundant element in a register 40, the redundancy circuit 38 relays the error code in the register 40 to the state machine 30. During an erase operation, the state machine 30 executes an erase operation algorithm that is specific to each error code. For example, if the error code indicates a row-to-row short, the algorithm disables the redundancy circuit from redirecting the address request to the redundancy rows during the pre-program cycle and the soft program cycle. Moreover, if the error code indicated an isolated error, like a bad memory cell or a broken column or row, the state machine 30 would conduct a typical erase operation algorithm.

Figure 3:
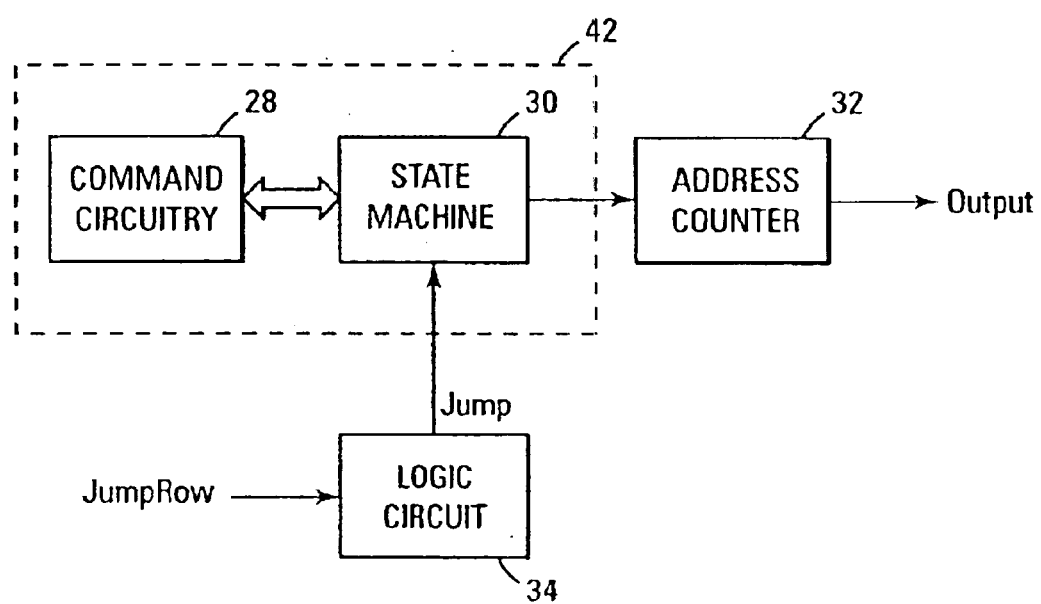
FIG. 3 is a block diagram illustrating the control circuitry, logic circuit and address counter of one embodiment of the present invention.

Moreover, in one embodiment of the present invention, when an error code indicates a row-to-row short, the redundancy circuit 38 sends an enable or Jump-Row signal to the logic circuit 34 (see FIG. 3). The logic circuit then sends a jump row or Jump-Row signal to the state machine 30, or control circuitry 42. The Jump-Row signal indicates that the state machine 30 should direct the address counter 32 to skip over the next row address after the respective pre-program pulse or soft program pulse is applied to the current row.

Figure 4:
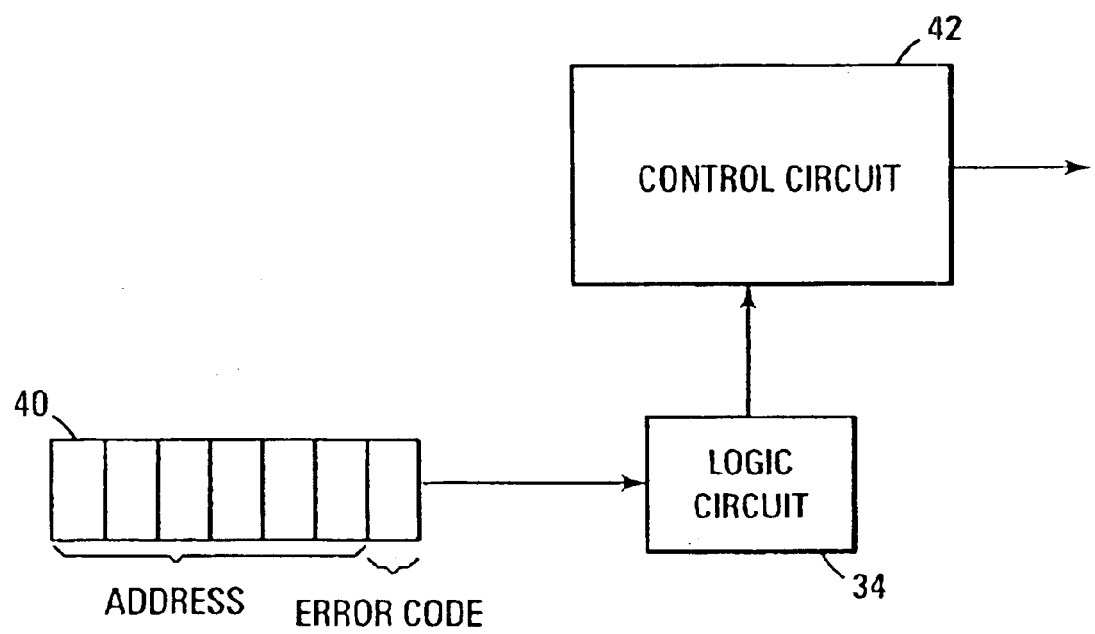
FIG. 4 a block diagram illustrating another embodiment of the control circuitry, logic circuit and address counter of the present invention.

In FIG. 2, the register 40 is shown as having two bits to store an error code. This allows four possible types of errors to be stored. It will be appreciated by those in the art that the number of bits can vary to change number of possible error types that can be stored and that the present invention is not limited to two bits. For example, in another embodiment, the register only provides one bit to store the error code. This is illustrated in FIG. 4. In this embodiment, the one bit indicates if the error is a row-to-row short or some other type of error. For example, a row-to-row short could be indicated by the one bit being in a low state and for other types of errors being in a high state. Therein, when the logic circuit knows it is dealing with a row-to-row short when a low state is received and it is not dealing with a row-to-row short when a high state is received. A redundant circuit is not needed to decode the error code, in this embodiment.

Figure 5:
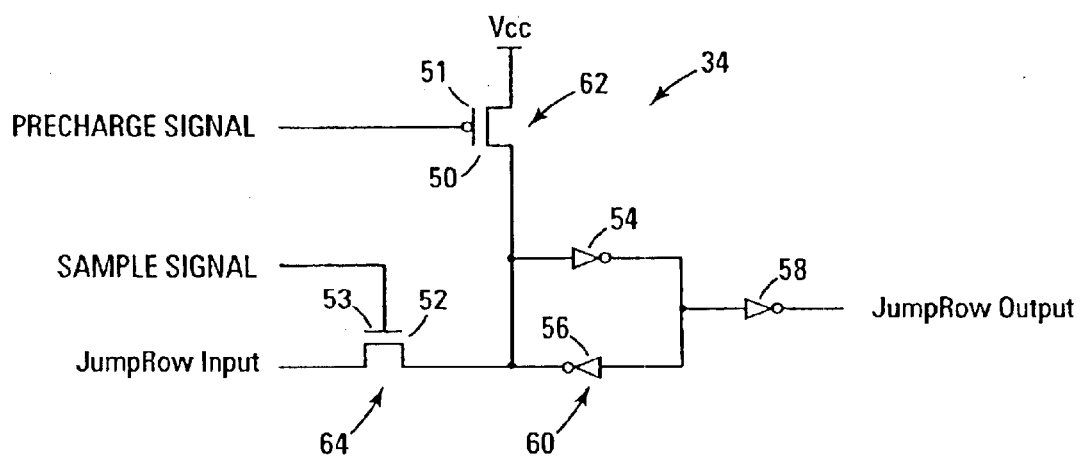
FIG. 5 is a schematic diagram illustrating one embodiment of the logic circuit.

One embodiment of the logic circuit 34 is illustrated in FIG. 5. As illustrated, the logic circuit 34 has a latch 60, a pre-charge circuit 62 and a sample circuit 64. The latch 60 has three inverters 54, 56, and 58. The output of inverter 58 is the output of the logic circuit 34 or the jump-row output. The pre-charge circuit 62 and the sample circuit 64 control input to the latch 60. The pre-charge circuit 62 has a pre-charge transistor 51. When the pre-charge transistor 50 is activated, a high output signal, generated by Vcc, is output. Applying a pre-charge signal to a control gate 51 of the pre-charge transistor 50 activates the pre-charge transistor. The pre-charge signal is applied when the row address is incremented. The sample circuit includes a jump-row transistor 52. Applying a sample signal to a control gate 53 of the jump-row transistor 52 activates the jump-row transistor 52. The sample signal is applied directly following the pre-charge signal. If an active low Jump-Row signal is present when the jump-row transistor 52 is activated, an active low Jump-Row signal is output from the logic circuit 34.

Figure 6:
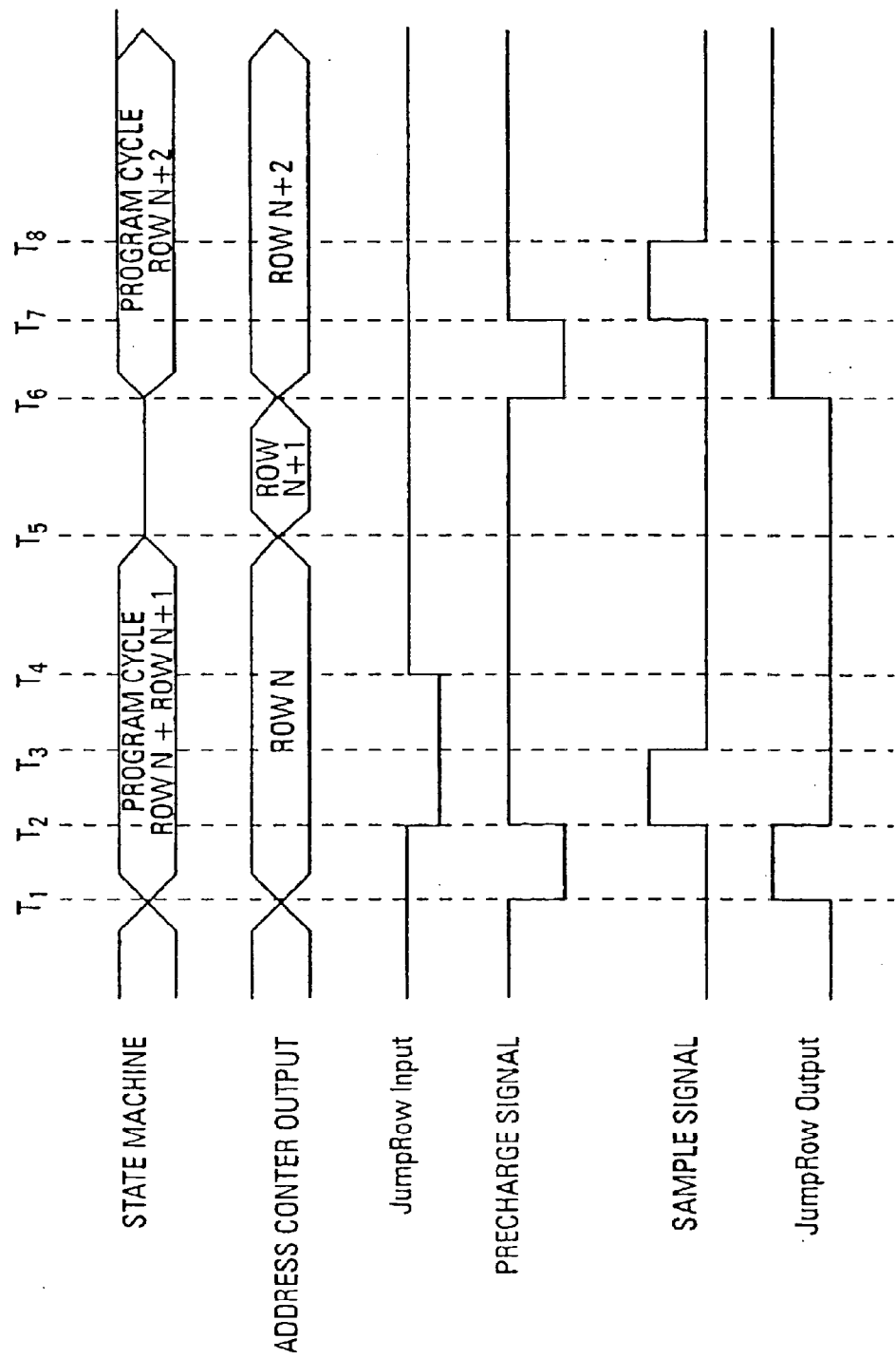
FIG. 6 is a chart illustrating the timing of the present invention.

A timing diagram illustrating the application of the present invention during a pre-program cycle or a soft program cycle on a pair of rows shorted together (row N and row N+1) is illustrated in FIG. 6. At time T1, a program cycle on row N and row N+1 is initiated. The state machine 30 sends the pre-charge signal to the control gate 51 of the pre-charge transistor 50. The jump-row output signal of the logic circuit 43 then goes to a high state. At time T2, the sample signal is applied to the control gate 53 of the jump-row transistor 52, which activates the jump-row transistor 52. If the redundancy circuit 38 matches the row address to a redundancy row address and the error code indicates a row-to-row short, logic circuit 34 receives a Jump-Row signal from the redundancy circuit 38. The jump-row output signal then goes to a low state. The state machine 30 then directs the address counter 32 to increment the row address to row N+1 when the initial pre-program or soft program cycle is complete (T5), but prior to a typical address count (T6). The state machine 30 then directs the address counter 32 to increment the row address to N+2 at T6.

The pre-program or soft program cycle is then continued with row N+2. At the start of the pre-program or soft program cycle on row N+2 (T6), the state machine sends the pre-charge signal to the control gate 51 of the pre-charge transistor 50. The jump-row output of the logic circuit 34 then goes to a high state. The sample signal is then applied at T7 to the control gate 53 of the jump row transistor 52 thereby activating the jump row transistor 52. Since row N+2 is not shorted to another row, the Jump-Row is not sent by the redundancy circuit 38 and the jump row output remains in a high state at T8.

Figure 7:
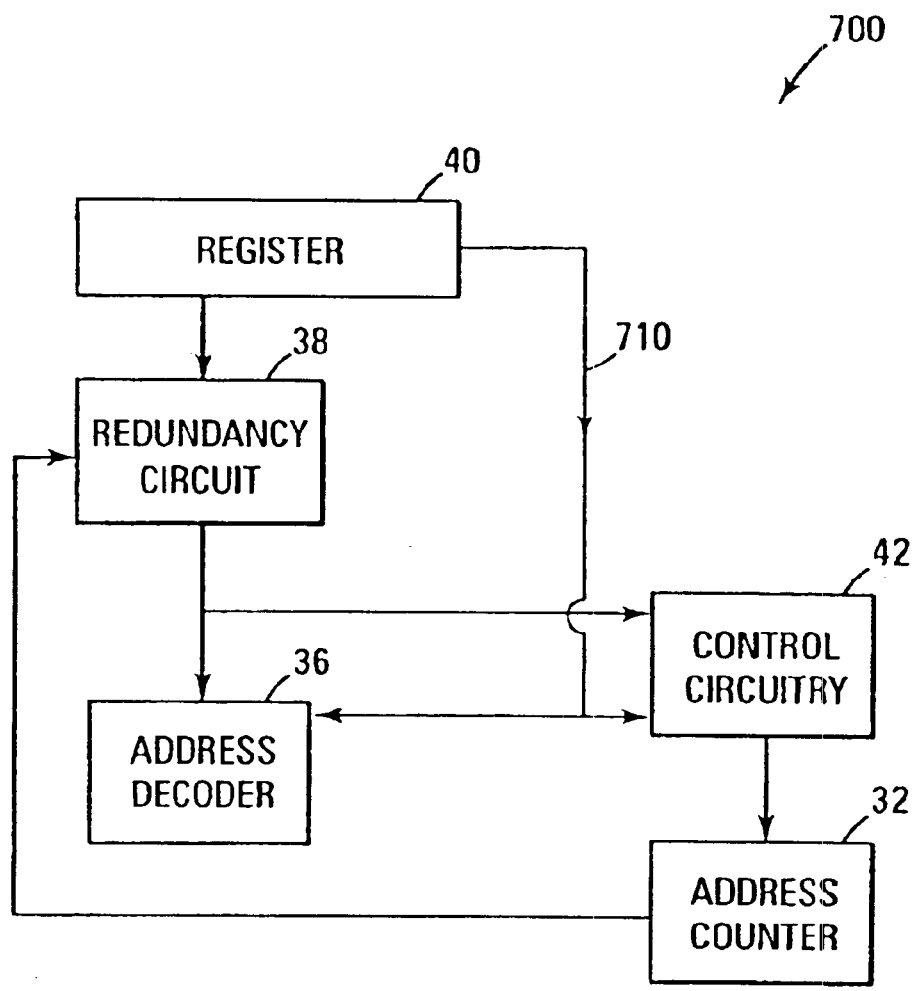
FIG. 7 is a block diagram illustrating redundant circuitry of a memory device according to another embodiment of the present invention.

FIG. 7 illustrates an embodiment of redundant circuitry 700 connectable to a memory array, such as memory array 20 of FIG. 1, having redundant elements, such as redundant columns 24 and redundant rows 26 of memory array 20. Redundant circuitry 700 includes control circuitry 42 and address counter 32. Redundant circuitry 700 further has address decoder 36 coupled to control circuitry 42. Redundancy circuit 38 is coupled between address decoder 36 and redundant register 40 and is also coupled to address counter 32. Register 40 is also coupled to control circuitry 42 and address decoder 32. In one embodiment, additional circuitry, such as logic circuitry is coupled between register 40 and control circuitry 42 and address decoder 36.

In various embodiments, register 40 is as shown in FIG. 5 and includes one extra bit. In these embodiments, the one extra bit indicates two different types of row-to-row shorts. For example, if two successive rows are shorted together (hereinafter called a two-row short), the one extra bit being at a low level indicates the two-row short, and if four successive rows are shorted together (hereinafter called a four-row short), the one extra bit being at a high level indicates the four-row short. The bit logic levels can be switched in another embodiment and are not limited to high and low as described.

Figure 8:
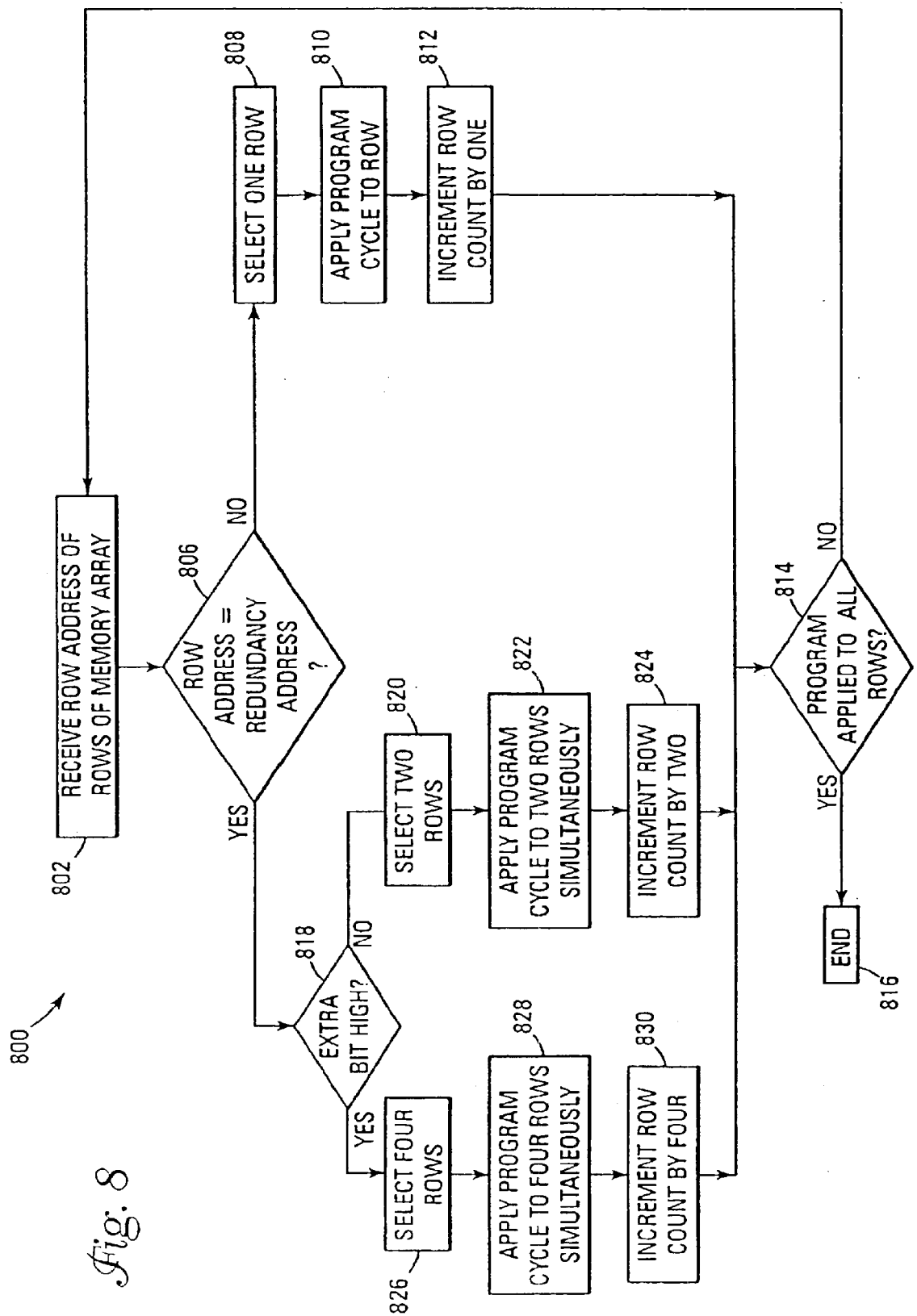
FIG. 8 is a flowchart of a method of operating a memory device according to another embodiment of the present invention.

FIG. 8 is a flowchart illustrating an embodiment of a method 800 of operating a redundant memory device that includes redundant circuitry 700 during a pre-program or a soft program (or heal) cycle of an erase cycle. Hereinafter, "program cycle" will be used when referring to either the pre-program or the soft program cycle.

At block 802, redundancy circuit 38 receives row addresses of rows of the memory array from address counter 32. Redundancy circuit 38 compares a redundancy address to the row address at decision block 806. If the row address does not match the redundancy address, address decoder 36 selects the one row at block 808 and control circuitry 42 applies the program cycle to the selected row at block 810 and increments address counter 32 by one row at block 812. Method 800 proceeds to decision block 814. If the program cycle has been applied to all of the rows at decision block 814, method 800 ends at block 816.

Otherwise method 800 returns to block 802, and redundancy circuit 38 compares the redundancy address to the next row address. If the row address matches the redundancy address, method 800 proceeds to decision block 818. If the one extra bit is at a low level at decision block 818, e.g., indicating a two-row short, the one extra bit is read from register 40 by address decoder 36, as indicated by arrow 710 of FIG. 7, and address decoder 36 selects two rows at block 820. The one extra bit is also read by control circuitry 42, and control circuitry 42 applies the program cycle to the selected two rows simultaneously at block 822 and increments address counter 32 by two rows at block 824. Method 800 proceeds to decision block 814. If the program cycle has been applied to all of the rows at decision block 814, method 800 ends at block 816.

Otherwise method 800 returns to block 802 and redundancy circuit 38 compares the redundancy address to the next row address (incremented by two rows). If the row address matches the redundancy address, method 800 proceeds to decision block 818. If the one extra bit is at a high level at decision block 818, e.g., indicating a four-row short, the one extra bit is read from register 40 by address decoder 36, as indicated by arrow 710 of FIG. 7, and address decoder 36 selects four rows at block 826. The one extra bit is also read by control circuitry 42, and control circuitry 42 applies the program cycle to the selected four rows simultaneously at block 828 and increments address counter 32 by four rows at block 830. Method 800 proceeds to decision block 814. If the program cycle has been applied to all of the rows at decision block 814, method 800 ends at block 816.

Figure 9:
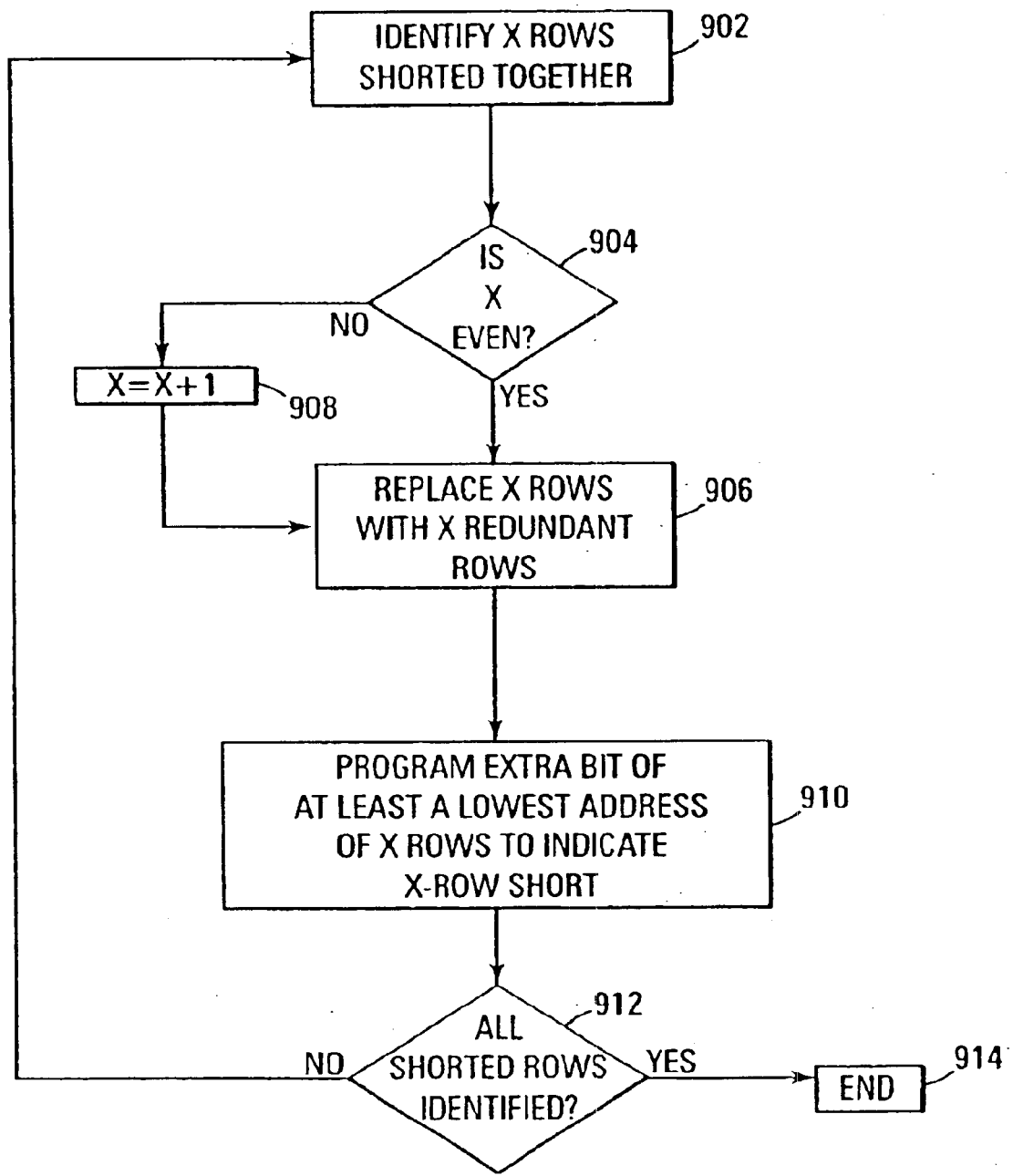
FIG. 9 is a flowchart of a method of repairing a memory device according to another embodiment of the present invention.

FIG. 9 is a flowchart illustrating a method 900 for repairing a memory device, such as flash memory device 18 of FIG. 1, for defects according to another embodiment of the present invention. The memory device has a memory array, such as memory array 20 of FIG. 1, having an array of columns and rows, such as primary memory array 22, redundant columns, such as redundant columns 24, and redundant rows, such as redundant rows 26.

At block 902, method 900 identifies x rows successively shorted together. If x is even at decision block 904, the x rows are replaced at block 906 by x redundant rows by programming a redundant register of the memory device, such as redundant register 40 of FIG. 5, to include redundancy addresses of x redundant rows corresponding to addresses of the x rows. If x is odd at decision block 904, x is increased by one at block 908, giving x+1 rows; the x+1 rows are replaced at block 906 by x+1 redundant rows; and the redundancy addresses of the x+1 redundant rows correspond to addresses of the x+1 rows. This means that when an odd number of rows are shorted together, each of the odd number of shorted rows plus the next row, regardless if the next row is good or defective, are replaced with a redundant row at block 906. Moreover, the redundant register is programmed to include a redundancy address for each of the odd rows shorted together plus the next row.

At block 910, an extra bit of the redundant register corresponding to at least a lowest redundancy address of the x rows is programmed such that one bit level indicates a x-row short. For example, the extra bit being at a low level indicates an x-row short. Alternatively, the extra bit being at a high level can indicate an x-row short. When an odd number of rows are shorted together (x is odd), the extra bit is programmed to indicate an (x+1)-row short that includes the odd number of rows shorted together plus the next row. If all of the shorted rows are identified at decision block 912, the method ends at block 914. Otherwise, the method continues at block 902.

In other embodiments, a defect is detected in a single row. In these embodiments, the single row plus the next row, regardless if the next row is good or defective, are replaced by two redundant rows, and the extra bit is programmed such that at least the address of the single row indicates a two-row defect.

CONCLUSION

Embodiments of the present invention have been described. The embodiments provide a memory device incorporating redundant rows. The memory device includes a memory array, control circuitry, and a register. The control circuitry controls operations to the memory array. The register stores a redundancy address of a defect in the memory array and a first or second bit level respectively indicative of two rows or four rows of the memory array shorted together. The control circuitry instructs an address counter, during an erase operation, to increment row addresses of the rows of the memory array by two rows when the bit is at the first level or four rows when the bit is at the second level.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, the extra bit being at a low level can indicate a four-row short and the extra bit being at a high level can indicate a two-row short. It is manifestly intended that this invention be limited only by the following claims and equivalents thereof.

What is claimed is:

1. A memory device comprising:
   a memory array; and
   redundant circuitry connected to the memory array, the redundant circuitry comprising a register adapted to indicate different types of row-to-row shorts.

2. The memory device of claim 1, wherein the redundant circuitry further comprises an address decoder for selecting, during an erase operation, x rows of the memory array for a row-to-row short of x rows when x rows are shorted together and x is even or x+1 rows for a row-to-row short of x+1 rows when x rows are shorted together and x is odd.

3. The memory device of claim 1, wherein the redundant circuitry further comprises control circuitry for controlling memory operations and for instructing an address counter, during an erase operation, to increment row addresses of rows of the memory array by x rows for a row-to-row short of x rows when x rows are shorted together and x is even or x+1 rows for a row-to-row short of x+1 rows when x rows are shorted together and x is odd.

4. A memory device comprising:
   a memory array; and
   redundant circuitry connected to the memory array, the redundant circuitry comprising a register adapted to indicate an x-row short when x rows of the memory are shorted together and x is even and an (x+1)-row short when x rows of the memory are shorted together and x is odd.

5. The memory device of claim 4, wherein the redundant circuitry further comprises an address decoder for selecting, during an erase operation, x rows of the memory array when x is even or x+1 rows when x is odd.

6. The memory device of claim 4, wherein the redundant circuitry further comprises a redundancy circuit for comparing row addresses of the rows of the memory array to a redundancy address of the register.

7. The memory device of claim 4, wherein the memory array comprises non-volatile memory cells.

8. The memory device of claim 4, wherein the redundant circuitry further comprises control circuitry for controlling memory operations and for instructing an address counter, during an erase operation, to increment row addresses of the rows of the memory array by x rows when x is even or x+1 rows when x is odd.

9. A memory device comprising:
   a memory array arranged in rows and columns and having at least four redundant rows for selectively replacing associated defective rows in the memory array;
   a register associated with each of the redundant rows, each register adapted to store a redundancy address corresponding to an address of the associated defective row in the memory array and to store a first bit level indicative of an x-row short when x rows of the memory array are shorted together and x is even, or a second bit level indicative of an (x+1)-row short when x rows of the memory array are shorted together and x is odd;
   a redundancy circuit for comparing row addresses of the rows of the memory array to a redundancy address stored in a redundant element's register; and
   control circuitry to control memory operations, wherein the control circuitry is adapted to apply a program cycle of an erase operation to x rows of the memory array simultaneously and to instruct an address counter to increment the row addresses by x rows when the first bit level is stored in that redundant element's register and one of the row addresses matches the redundancy address stored in that redundant element's register, and wherein the control circuitry is adapted to apply the program cycle to x+1 rows of the memory array simultaneously and to instruct the address counter to increment the row addresses by x+1 rows when the second bit level is stored in that redundant element's register and one of the row addresses matches the redundancy address stored in that redundant element's register.

10. The memory device of claim 9, further comprising an address decoder for selecting, during an erase operation, when one of the row addresses matches the redundancy address stored in that redundant element's register, x rows of the memory array when the first bit level is stored in that redundant element's register or x+1 rows when the second bit level is stored in that redundant element's register.

11. The memory device of claim 10, wherein the address decoder is adapted to select, during an erase operation, one row of the memory array when one of the row addresses does not match the redundancy address stored in that redundant element's register.

12. The memory device of claim 9, wherein the control circuitry is further adapted to instruct the address counter, during an erase operation, to increment the row addresses by one row when one of the row addresses does not match the redundancy address stored in that redundant element's register.

13. The memory device of claim 9, wherein the control circuitry is further adapted to apply a program cycle of an erase operation to one row of the memory array when one of the row addresses does not match the redundancy address stored in that redundant element's register.

14. The memory device of claim 9, wherein the memory array comprises non-volatile memory cells.

15. A memory device, comprising:
   a memory array having primary elements and redundant elements;
   control circuitry for controlling access to the memory array;
   redundancy circuitry for selectively routing access requests directed to a defective primary element to an associated redundant element; and
   a register associated with each of the redundant elements, each register adapted to store an address representative of a defective primary element and an error code;
   wherein the control circuitry is adapted to perform an erase operation on the memory device;
   wherein the control circuitry is further adapted to receive the error code from a redundant element's register when an address request for the erase operation matches the address stored in that register; and
   wherein the control circuitry is further adapted to disable the redundancy circuitry during a portion of the erase operation if the received error code is indicative of a row-to-row short.

16. The memory device of claim 15, further comprising an address decoder for selecting, during the erase operation, x rows of the memory array when the error code is indicative of a row-to-row short of x rows when x rows are shorted together and x is even or x+1 rows when the error code is indicative of a row-to-row short of x+1 rows when x rows are shorted together and x is odd.

17. The memory device of claim 15, wherein the control circuitry is further adapted to instruct an address counter, during the erase operation, to increment row addresses of the rows of the memory array by x rows when the error code is indicative of a row-to-row short of x rows when x rows are shorted together and x is even or x+1 rows when the error code is indicative of a row-to-row short of x+1 rows when x rows are shorted together and x is odd.

18. A method for operating a memory device, the method comprising:
   reading a bit of a redundant register, the bit being at a first level indicative of an x-row short when x rows of a memory array are shorted together and x is even or a second level indicative of an (x+1)-row short when x rows of the memory array are shorted together and x is odd;

applying a program cycle of an erase operation to the x rows shorted together when the bit is at the first level or to the x rows shorted together plus a next row when the bit is at the second level; and incrementing a row address by x rows when the bit is at the first level or by x+1 rows when the bit is at the second level.

19. The method of claim 18, further comprising matching a row address of a row of the memory array with a redundancy address of the redundant register before reading the bit of the redundant register.

20. The method of claim 18, wherein applying the program cycle of the erase operation comprises applying a pre-program or a soft program cycle of the erase operation.

21. A method for operating a memory device, the method comprising:

comparing a row address of a row of a memory array to a redundancy address of a register, the redundancy address corresponding to a defective row of the memory array;

reading a bit of the register when the row address matches the redundancy address, the bit being at a first level indicative of an x-row short when x rows of the memory array are shorted together and x is even or a second level indicative of an (x+1)-row short when x rows of the memory array are shorted together and x is odd;

applying a program cycle of an erase operation to the x rows shorted together simultaneously when the bit is at the first level or to the x rows shorted together plus a next row simultaneously when the bit is at the second level; and incrementing the row address by x rows when the bit is at the first level or by x+1 rows when the bit is at the second level.

22. The method of claim 21, wherein applying the program cycle of the erase operation comprises applying a pre-program or a soft program cycle of the erase operation.

23. The method of claim 21, further comprising applying the program cycle to one row when the row address does not match the redundancy address.

24. The method of claim 21, further comprising incrementing the row address by one row when the row address does not match the redundancy address.

25. A method of operating a memory device, comprising:

comparing an address request to an address stored in a register, wherein the address stored in the register is representative of a defective row or column;

when the address request matches the address stored in the register, relaying an error code associated with the address stored in the register to a control circuitry adapted to perform at least erase operations on the memory device;

if the error code is indicative of a row-to-row short, disabling redundant circuitry during a portion of the erase operation; and if the error code is indicative of an isolated error, performing a typical erase operation using the redundant circuitry.

26. The method of claim 25, wherein the method, after performing an erase operation, further comprises:

incrementing an address counter by one if the address request does not match the address stored in the register or the address request matches the address stored in the register and the error code is indicative of an isolated error;

incrementing the address counter by x if the address request matches the address stored in the register and the error code is indicative of a row-to-row short of x rows when x rows are shorted together and x is even; and incrementing the address counter by x+1 if the address request matches the address stored in the register and the error code is indicative of a row-to-row short of x+1 rows when x rows are shorted together and x is odd.

27. The method of claim 25, further comprising when the address request matches the address stored in the register, performing the at least erase operations on x rows when the error code is indicative of a row-to-row short of x rows when x rows are shorted together and x is even or x+1 rows when the error code is indicative of a row-to-row short of x+1 rows when x rows are shorted together and x is odd.

28. A flash memory device comprising:

a memory array comprising non-volatile cells; and redundant circuitry connected to the memory array, the redundant circuitry comprising a register adapted to indicate an x-row short when x rows of the memory are shorted together and x is even and an (x+1)-row short when x rows of the memory are shorted together and x is odd.

29. The flash memory device of claim 28, wherein the redundant circuitry further comprises an address decoder for selecting, during an erase operation, x rows of the memory array when x is even or x+1 rows when x is odd.

30. The flash memory device of claim 28, wherein the redundant circuitry further comprises a redundancy circuit for comparing the row addresses of the rows of the memory array to a redundancy address of the register.

31. The flash memory device of claim 28, wherein the redundant circuitry further comprises control circuitry for controlling memory operations and for instructing an address counter, during an erase operation, to increment row addresses of the rows of the memory array by x rows when x is even or x+1 rows when x is odd.

32. A flash memory device comprising:

a memory array of non-volatile memory cells arranged in rows and columns and having at least four redundant rows for selectively replacing an associated defective row in the memory array;

a register associated with each of the redundant rows, each register adapted to store a redundancy address corresponding to an address of the associated defective row in the memory array and to store a first bit level indicative of an x-row short when x rows of the memory array are shorted together and x is even, or a second bit level indicative of an (x+1)-row short when x rows of the memory array are shorted together and x is odd;

a redundancy circuit for comparing row addresses of the rows of the memory array to a redundancy address stored in a redundant element's register; and control circuitry to control memory operations, wherein the control circuitry is adapted to apply a program cycle of an erase operation to x rows of the memory array simultaneously and to instruct an address counter to increment the row addresses by x rows when the first bit level is stored in that redundant element's register and one of the row addresses matches the redundancy address stored in that redundant element's register, and wherein the control circuitry is adapted to apply the program cycle to x+1 rows of the memory array simultaneously and to instruct the address counter to increment the row addresses by x+1 rows when the second bit level is stored in that redundant element's register and one of the row addresses matches the redundancy address stored in that redundant element's register.

33. The flash memory device of claim 32, further comprising an address decoder for selecting, during an erase operation, when one of the row addresses matches the redundancy address stored in that redundant element's register, x rows of the memory array when the first bit level is stored in that redundant element's register or x+1 rows when the second bit level is stored in that redundant element's register.

34. The flash memory device of claim 33, wherein the address decoder is adapted to select, during an erase operation, one row of the memory array when one of the row addresses does not match the redundancy address.

35. The flash memory device of claim 32, wherein the control circuitry is further adapted to instruct the address counter, during an erase operation, to increment the row addresses by one row when one of the row addresses does not match the redundancy address stored in that redundant element's register.

36. The flash memory device of claim 32, wherein the control circuitry is further adapted to apply a program cycle of an erase operation to one row of the memory array when one of the row addresses does not match the redundancy address stored in that redundant element's register.

* * * * *